United States Patent [19]
Miller et al.

[11] Patent Number: 4,506,348
[45] Date of Patent: Mar. 19, 1985

[54] VARIABLE DIGITAL DELAY CIRCUIT

[75] Inventors: Ronald P. Miller, Shipshewana; William H. Chiles; Bill L. Masteller, both of Mishawaka, all of Ind.

[73] Assignee: Allied Corporation, Morris Township, Morris County, N.J.

[21] Appl. No.: 388,057

[22] Filed: Jun. 14, 1982

[51] Int. Cl.³ .............................................. G11C 7/00
[52] U.S. Cl. ................................... 365/73; 365/189; 365/230
[58] Field of Search ................... 365/73, 76, 78, 189, 365/194, 230, 239, 240

[56] References Cited

U.S. PATENT DOCUMENTS

| | | | |
|---|---|---|---|
| 3,596,259 | 7/1971 | Teramura et al. | 365/73 |
| 4,156,286 | 5/1979 | Connors et al. | 365/73 |
| 4,400,801 | 8/1983 | Kible | 365/189 X |

Primary Examiner—Joseph A. Popek
Attorney, Agent, or Firm—Anthony F. Cuoco; Stanley N. Protigal

[57] ABSTRACT

A variable digital delay circuit is disclosed which utilizes a shift register to periodically sample a signal to be delayed and after a predetermined number of samples are collected as a group of zeros and ones making up a binary word the word is stored in parallel in a memory. After each binary word is stored in a memory a binary word previously stored in the memory is read out into a buffer store from which each individual bit is sequentially read out using a multiplexer at the same rate that the bits were originally taken to thereby recreate the original signal samples. The time delay is determined by how long the previously stored binary word being read out has been stored in the memory.

10 Claims, 6 Drawing Figures

VARIABLE DIGITAL DELAY CIRCUIT

BACKGROUND OF THE INVENTION

This invention relates to digital signal delay circuits.

In the prior art delay circuits and lines for digital signals have been implemented utilizing shift registers and analog delay lines which have served well when relatively short delay times are required. However, when utilizing such techniques for long delay times the result is expensive and requires a lot of space. Thus, there is a need in the art for a digital signal delay circuit that can provide long delays while being relatively small.

SUMMARY OF THE INVENTION

The above need in the prior art is satisfied by our invention which is a variable digital delay circuit that is relatively small and can provide long delay times to digital signals.

Our novel variable digital delay circuit delays a digital signal by sampling the signal and storing the samples in a memory. After a predetermined time equal to the desired signal delay the samples are read out of the memory to recreate the digital signal. The digital signal to be delayed is periodically sampled at a rate which preserves the intelligence of the signal. These periodic samples are stored in a shift register to form a binary word of a predetermined length. As each binary word is assembled the completed binary word is transferred to a buffer storage means in which it is held briefly before it is stored in the memory. In between storing binary words in the memory, timing circuitry and logic circuitry in the form of a multiplexer cause the previously stored binary words to be read out of the memory one by one and temporarily stored in a second buffer storage. The individual binary bits of the binary word stored in the second buffer storage are read out by logic circuitry in the form of a multiplexer at the same rate at which they were originally sampled to recreate the original but at the predetermined delay.

DESCRIPTION OF THE DRAWING

Our invention will be better understood upon reading the following detailed description in conjunction with the drawing in which.

DETAILED DESCRIPTION

Figure 1:
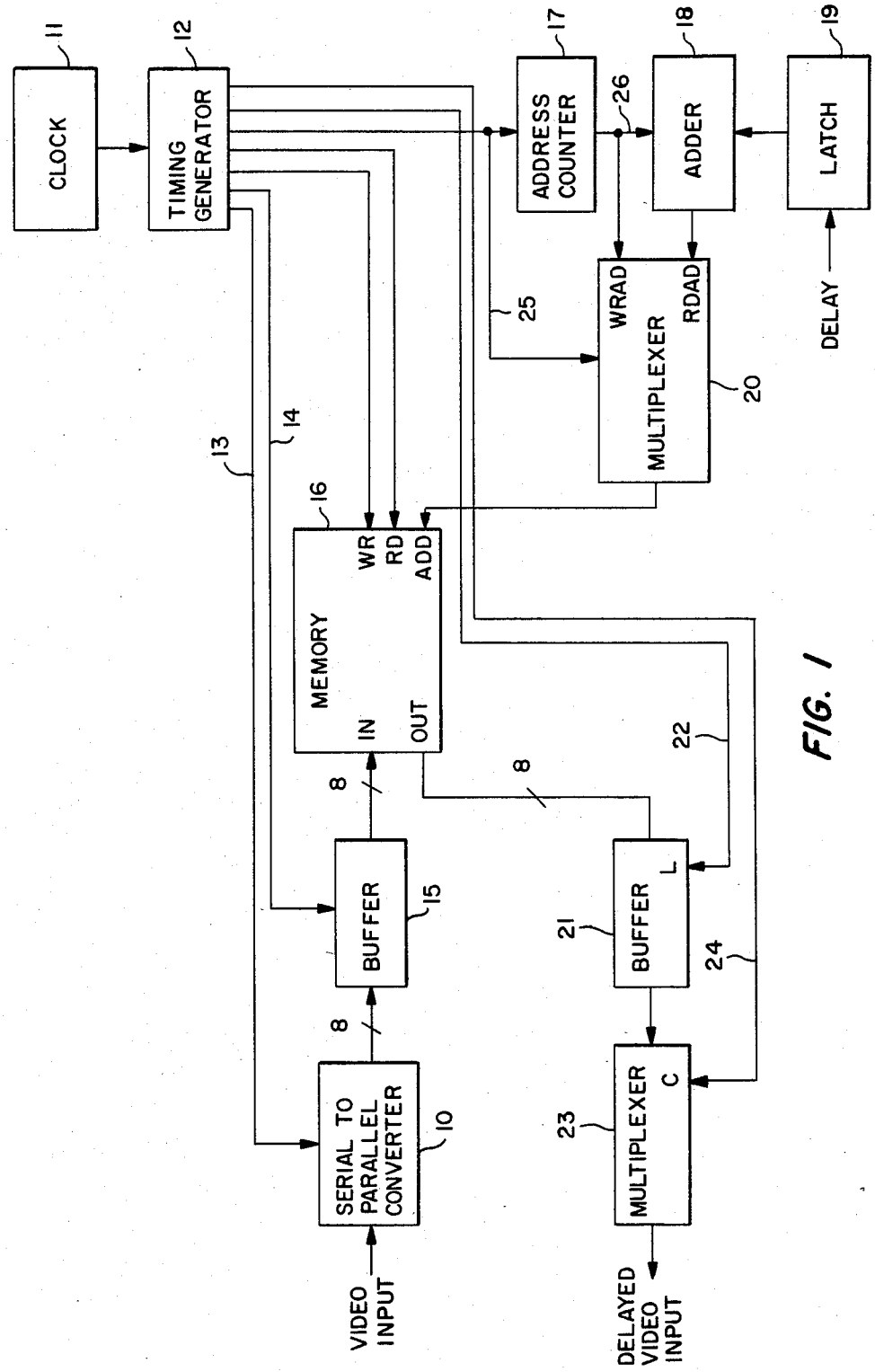
FIG. 1 is a schematic block diagram of our invention.

In FIG. 1 is seen a schematic block diagram of our invention. A signal to be delayed is applied to the Video Input and the delayed signal output from our novel variable digital delay circuit is output at the Delayed Video Output. As briefly described in the summary of the invention the input digital signal is sampled and the samples are formed into binary words which are stored in a memory. The sampling process is accomplished via a serial to parallel converter 10 which comprises a shift register under the control of clock 11 and timing generator 12. Circuits 11 and 12 cooperate as is described in detail hereinafter to apply clock timing signals over lead 13 to the shift register to periodically sample the digital signal applied to the Video Input of converter 10. In this manner a binary word is created in the shift register of converter 10 and each bit of the word is a sample of the input digital signal. In this embodiment of the invention serial to parallel converter 10 samples the input digital signal eight times to create an eight bit binary word filling the shift register comprising converter 10. As converter 10 is under control of circuits 11 and 12 these circuits can determine when there is an eight bit binary word stored in converter 10. Then circuits 11 and 12 apply a signal over lead 14 to buffer storage circuit 15 causing this circuit to store the eight bit binary word that has been assembled in converter 10. The operation of converter 10 under the control of circuits 11 and 12 continues uninterrupted to continue sampling the input digital signal to assemble another eight bit binary word. Before the next eight bit binary word is assembled in converter 10, clock 11 and timing generator 12 cooperate to control memory 16 to store each eight bit binary word stored in buffer storage circuit 15. Thereafter buffer 15 is available to store the next eight bit binary word assembled in converter 10 from the sampling process. Eight bit binary words assembled in converter 10 and temporarily stored in buffer 15 are stored in sequential eight bit word locations in memory 16.

Immediately following storing each eight bit word in memory 16, clock 11, timing generator 12, address counter 17, adder 18, latch 19 and address multiplexer circuit 20 cooperate to read a previously stored eight bit binary word out of memory 16 into buffer storage circuit 21. A detailed description of how these previously listed circuits cooperate to store words in and read words out of memory 16 is found further in this specification. Determining which previously stored binary words are to be read out of memory 16 is a function of the time delay introduced by our novel circuit and is described in greater detail further in this specification. Each eight bit binary word read out of memory 16 is placed in buffer storage circuit 21 in parallel format under control of a signal on lead 22 from timing generator 12 to the load input L of buffer 21. Each eight bit word stored in buffer 21 is then converted to serial format. To perform this parallel to serial conversion multiplexer 23 is utilized which is under the control of signals from timing generator 12 over lead 24 to the clocking input C of multiplexer 23. Under this control multiplexer 23 sequentially reads the eight binary bits of each eight bit binary word stored in buffer storage 21 at the same rate at which these bits were initially sampled from the digital signal applied to the Video Input of our novel circuit. The serial signal output from our novel circuit at the Delayed Video Output is the same as the input signal but delayed in accordance with the teaching of our invention.

To alternately read and write binary words into and out of memory 16 our invention operates in the following manner. Memory 16 has a writing input WR which when energized causes memory 16 to write whatever eight bit binary word is present at the input IN in the address location identified by a binary word at the address input ADD. Memory 16 also has a reading input RD which when energized causes the word stored in a location of memory 16 identified by a binary word at the addressing input ADD to be read out at output OUT. Timing generator 12 driven by clock 11 periodically and cyclically energizes write input WR and read input RD to thereby alternate memory 16 between a writing mode and a reading mode. In the writing mode the eight bit binary word stored in buffer storage circuit 15 when writing input WR is energized is stored in memory 16, while in the reading mode an eight bit binary word previously stored in memory 16 is read out and placed in buffer storage circuit 21.

As the write addresses and the read addresses are continuously changing and may be different from each other circuitry is provided to change these addresses. To alternately select write and read addresses, a multiplexer circuit 20 having two inputs, WRAD and RDAD, and one output is provided. Multiplexer circuit 20 is under the control of an output from timing generator 12 over lead 25 to alternately apply one of the two inputs to this circuit to the addressing input ADD of memory 16. The two inputs of multiplexer 20 are the write address at input WRAD and the read address at input RDAD. In this manner write addresses and read addresses are alternately applied to the addressing input ADD of memory 16.

The write addresses are generated by an output of timing generator 12 driving address counter 17. As address counter 17 is a counter the numerical count therein is incremented by pulses input thereto from timing generator 12. Address counter 17 is incremented just before an eight bit binary word stored in buffer 15 is to be stored in memory 16. Counter 17 also functions such that when it has a full count it automatically recycles back to a zero and recommences counting. The contents of address counter 17 are applied to the write address input WRAD of multiplexer 20. The read addresses are generated in a slightly different manner. The binary number stored in address counter 17 is applied to one input of adder circuit 18 and a binary number stored in latch circuit 19 is applied to a second input of adder 18. Adder circuit 18 sums these two binary numbers to derive a third binary number that is the read address which is applied to the read address input RDAD of multiplexer 20. For a given time delay with our novel circuit the difference between a write address and a read address is always constant. Accordingly, the binary number initially stored in latch 19 indicates this time delay. Actually, the binary number stored in latch 19 is the two's complement of the binary number indicating the desired delay. As is known in the art the sum of a two's complemented number with another number is the same as subtracting the uncomplemented number from the other number. Thus, the read address is output from adder circuit 18 to the read address RDAD input of multiplexer 20. Multiplexer 20 alternately connects the write address and read address applied to its two inputs to its output to be applied to the addressing input ADD of memory 16 to alternately write and read in memory 16 as described above.

Figure 2:
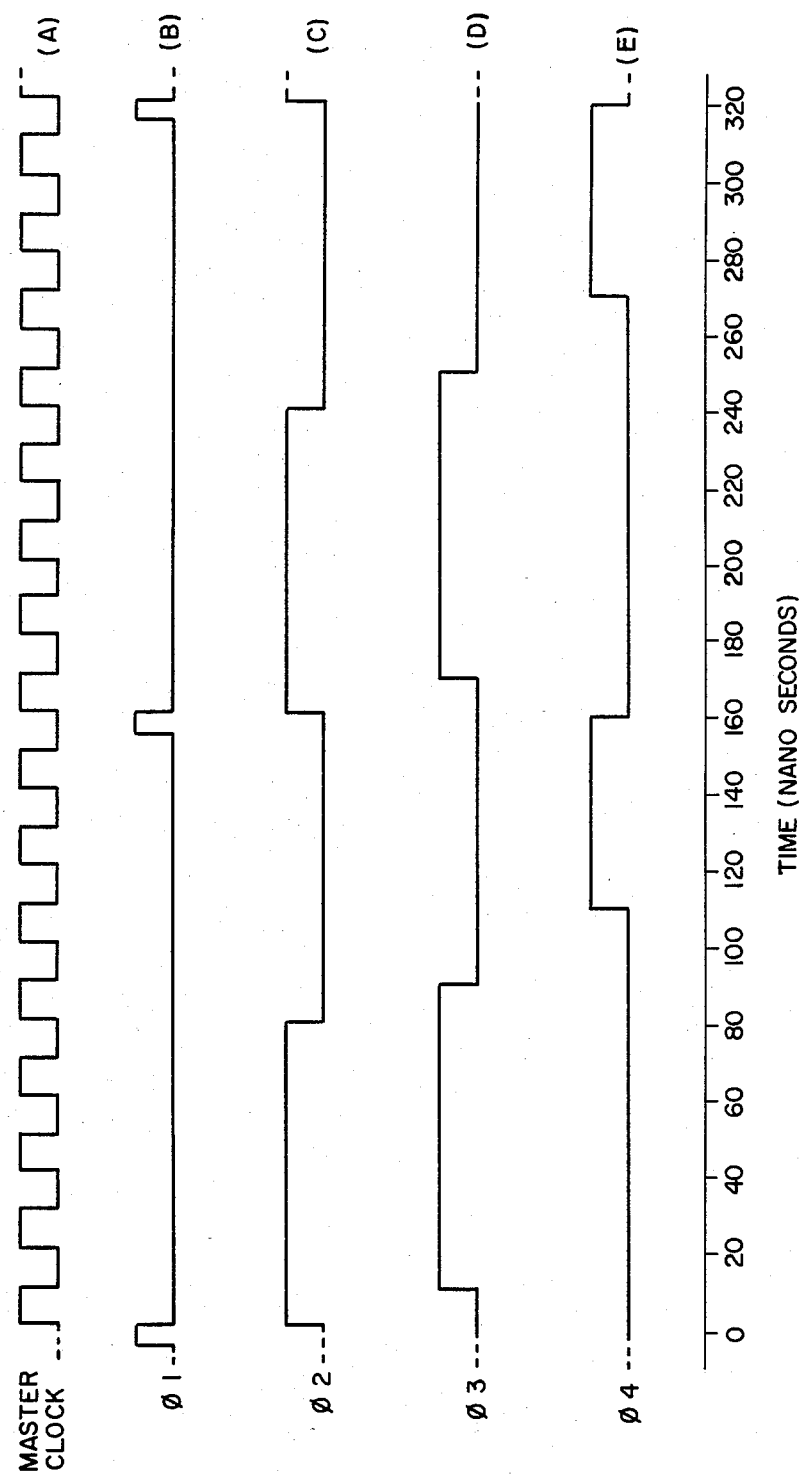
FIG. 2, consisting of A-E, is a timing diagram necessary for understanding the operation of our invention.

Turning now to FIG. 2, therein is shown the waveforms output from timing generator 12 driven by clock 11 to drive the other circuits of our novel variable digital delay circuit. In this embodiment of our invention clock 11 is a 50 megahertz oscillator. Timing generator 12 is a combination of logic circuits, combined in a manner well known in the art, providing the waveforms shown in FIG. 2 responsive to the 50 megahertz input from clock 11.

In FIG. 2A is shown a 50 megahertz master clock waveform output from timing generator 12 in response to the input from clock 11. This master clock signal is applied to lead 13 to operate the shift register of serial to parallel converter 10, and to lead 24 to output multiplexer 23. The period of the 50 megahertz master clock is 20 nanoseconds and during the 10 nanosecond positive half cycle of each cycle converter 10 is enabled to store in the first or input stage thereof the zero or one binary level of the signal applied to the Video Input to be delayed. If the signal applied to the Video Input is high when a positive half cycle of a master clock pulse occurs a one is stored in the input or first stage of the shift register of converter 10. For every eight master clock pulses on lead 13 there are eight bits stored in the shift register of converter 10. With the master clock signal having a period of 20 nanoseconds it takes between 0 and 160 nanoseconds for eight samples, but since the samples are taken on positive half cycles it really takes between 0 and 150 nanoseconds to write eight bits in converter 10. During the negative half cycle of each eighth cycle of the master clock, occurring between 150 and 160 nanoseconds the contents of converter 10 are transferred in parallel over eight leads to buffer storage circuit 15, thereby permitting the ninth through eighteenth pulses of the master clock to cause converter 10 to store the next eight signal samples between 160 nanoseconds and 320 nanoseconds. This operation is reflected by the waveform shown in FIG. 2B which shows the signal output from timing generator 12 to buffer storage circuit 15, and over lead 22 to buffer storage circuit 21. The ∅1 signal pulses shown in FIG. 2B are 5 nanoseconds wide and occur during the negative half cycle of every eighth master clock pulse. The ∅1 pulses applied to buffer storage circuits 15 and 21 enable these circuits to store the eight binary bits present on their eight input leads at the moment the pulses occur. The binary bits at the input will overwrite any previously stored binary bits in buffer circuits 15 or 21. Once the first eight binary bits stored in converter 10 are transferred to buffer 15 in parallel during the negative half cycle of the eighth master clock pulse the second eight sample bits of the signal present at the Video Input are shifted into the shift register of converter 10 and the first eight bits are merely shifted out from converter 10 and lost in a manner well known in the art. This is not detrimental as these first eight bits are now stored in buffer storage circuit 15. The next step in the operation of our novel circuit is to store the eight signal samples in the form of binary bits stored in buffer storage circuit 15 into memory 16 before the eighth through sixteenth binary bits are stored in converter 10 and are to be transferred to buffer storage circuit 16. Another output from timing generator 12 is the waveform ∅2 shown in FIG. 2C and has a period of 160 nanoseconds. This waveform is created by dividing the master clock signal frequency by eight. Waveform or signal ∅2 is output over lead 25 to be input to both address counter 17 and address multiplexer 20. Address counter 17 is a conventional type counter that, when full, returns to a count of zero and recounts. The accumulated binary count in address counter 17 responsive to signal ∅2 is used as the address to drive the addressing input of memory 16 during writing operation into the memory as is now described. The accumulated count in address counter 17 is output over leads 26 to both adder circuit 18 and to input WRAD of addressing multiplexer 20. Multiplexer 20 also responds to signal ∅2 on lead 25 to alternately select the write address and the read address and apply them to the addressing input ADD of memory 16 as previously described. In response to the positive half cycle of signal ∅2 the binary count in address counter 17 is incremented and the incremented count is applied to the write address input WRAD of multiplexer 20 which is also operated in response to signal ∅2 to connect the write address through multiplexer 20 to the addressing input ADD of memory circuit 16 during each positive half cycle of signal ∅2. During each negative half cycle of signal ∅2 multiplexer 20 is released and the read address at input RDAD is connected to the addressing input ADD of memory 16. Memory 16 also needs a write or read command input thereto in order to respectively write or read into or out of the address indicated by the binary number applied to its addressing input ADD.

In FIG. 2D is shown signal ∅3 which is the same as signal ∅2 but delayed 10 nanoseconds from signal ∅2. Signal ∅3 is output from timing generator 12 and is applied to the write input WR of memory 16. Thus, starting at 0 and 160 nanoseconds, upon the start of the positive half cycles of signal ∅2 there is a write address applied to the addressing input ADD of memory 16. 10 nanoseconds later at 10 nanoseconds and 170 nanoseconds signal ∅3 is applied to writing input WR of memory 16. Upon the concurrence of the signals applied to the writing input WR and to the addressing input ADD the eight bit binary words stored in input buffer 15 and applied in parallel over eight leads to the input IN of memory 16 is then written into memory 16 at the address indicated by the binary number being applied to the address input ADD. Signals ∅2 and ∅3 both remain high for a period of 80 nanoseconds to meet the approximate 35 nanosecond period required for signals to be present on the inputs of memory 16 to insure reliable operation. Thus, in reality, writing in memory 16 is reliably completed at approximately 45 nanoseconds or 205 nanoseconds for the waveforms shown in FIG. 2. During this period in which the eight bit binary word stored in buffer storage circuit 15 is being written into memory 16 the shift register of serial to parallel converter 10 is still functioning under the control of the master clock signal applied thereto over lead 13 to collect the next eight input signal samples as eight binary bits of another binary word.

Following completion of writing a binary word into memory 16 signals ∅2 and ∅3 shown in FIGS. 2C and 2D respectively go to their low state and the next function to be performed is to read a binary word out of memory 16 before the next eight bit word is transferred from converter 10 to buffer 15 for storage in memory 16. The address to be used for reading a word out of memory 16 is generated by adder circuit 18 which was generally described above. Adder circuit 18 has the binary number write address stored in address counter 17 input thereto along with a second binary number that is stored in latch 19. The binary number stored in latch 19 is input thereto before our novel delay circuit is utilized and indicates the delay that is to be provided by our novel circuit. As mentioned previously, the binary number stored in latch circuit 19 is the two's complement of the actual binary number indicating the desired delay. Thus, in a manner well known in the art, adder circuit 18 responds to the write address binary number input thereto and the delay binary number input thereto from latch circuit 19 to generate the read address which is output from adder circuit 18 and applied to the second input RDAD of address multiplexer circuit 20. All that is necessary to know at this point in the description of the operation of our delay circuit is that the binary number output from adder circuit 18 as the read address is always a fixed difference below the binary number stored in address counter 17. Thus, a binary number read out of memory 16 represents the signal samples of the signal at the Video Input that were stored in memory 16 at some period of time before the signals presently being written into memory 16 to thereby create the time delay.

During the negative half cycle of the signal ∅2 shown in FIG. 2C address multiplexer 20 is released allowing the read address binary number applied to its input RDAD to be applied to the addressing input ADD of memory 16. Thereafter, upon the appearance of a read signal at the read input RD of memory 16 a binary word will be read out of the memory. Referring to FIG. 2E therein is shown signal ∅4 which is output from timing generator 12 and applied to the read input RD of memory 16. Signal ∅4 goes high at 110 nanoseconds, which is 30 nanoseconds after signal ∅2 goes low. Upon the concurrence of the read address at the addressing input ADD and the read signal ∅4 at the read input RD the binary number stored in memory 16 at the indicated address is read out of memory 16 in parallel over eight output leads OUT and this binary number is applied to output buffer circuit 21 to be stored therein upon a subsequent command. 45 nanoseconds after memory 16 is enabled to read a binary number therefrom as just described, signal ∅1 appears on lead 22 to the load input L of output buffer circuit 21. Signal ∅1 was briefly described above and occurs between 155 and 160 nanoseconds and energizes buffer circuit 21 to store the eight bit binary number applied to its input from the output OUT of memory 16. At 160 nanoseconds both signals ∅1 and ∅4 go low. This completes one write and read cycle of memory 16 in the operation of our novel delay circuit. This process is repeated over and over again every 160 nanoseconds for the operation of our delay circuit.

During the period between 155 and 160 nanoseconds the binary word read out of memory 16 is stored in buffer storage circuit 21. At 150 nanoseconds a previously stored eight bit binary word stored in buffer 21 is completely read out therefrom responsive to the operation of multiplexer circuit 23 and the new binary word read out of memory 16 overwrites the previously stored binary word. Multiplexer circuit 23 has a clocking input C to which is applied the master clock signal via lead 24 as previously mentioned. Responsive to the master clock signal multiplexer 23 sequentially reads each of the eight bits stored in buffer circuit 21 at the same rate at which they were stored and outputs them from our novel delay circuit as the Delayed Video Output. Thus, delayed signals are being output at the Delayed Video Output at the same time as signals are being input and sampled at the Video Input. The delayed video output signal is the same as the signal stored in serial to parallel converter 10 except the output signal is delayed by a fixed increment of time in accordance with the teaching of our invention.

We return now to describe the greater detail generation of read addresses and a more detailed description of the determination of the amount of time delay that may be introduced utilizing our novel time delay circuit. In one embodiment of the invention a total of 256 binary words may be stored in memory circuit 16. If, for example, the current write address addresses memory location 253 the binary word applied to the addressing input ADD of memory 16 is the eight bit binary number 11111101. When an exemplary delay to be introduced by our novel circuit is a time delay indicated by the binary number 00000101, the two's complement of this binary number is the binary number 11111011 which is stored in latch circuit 19. Adder circuit 18 adds the write address binary number 11111101 and the two's complement binary number 11111011 to get a resultant binary number 11111000 which is the present read address, and in decimal format indicates that memory location 248 is to be read out. How these read and write addresses correlate to an exact time delay is described further in this specification.

As previously mentioned address counter 17 is a wraparound type counter and upon counting to its maximum recycles back to zero and recommences counting. Adder circuit 18 functions properly with this operation of address counter 17 as indicated by the following example. In the event that the current write address indicates the third word location in memory the binary number address is 00000010 as is known in the art. As previously mentioned, for this particular example, the binary number stored in latch circuit 19 in two's complement form is the binary number 11111011. Adder circuit 18 adds these two binary numbers and outputs the number 11111101 which in decimal form indicates that memory location 253 is being read out. Thus, for these two examples, the difference between the write address and the read address is always five even when address counter 17 has just recycled back to zero and is recounting.

The time delay introduced by our variable digital delay circuit is not infinitely variable but is actually variable in discrete steps. With the exemplary embodiment disclosed herein the minimum time delay that may be provided is 340 nanoseconds and, is variable in 160 nanosecond increments. The basic 160 nanosecond increment is merely a function of the time it takes to sample the signal at the video input of the circuit and assemble the binary words in the shift register of serial to parallel converter 10. In this specific embodiment of our invention with a master clock of 50 megahertz with a period of 20 nanoseconds and eight bit words being assembled in converter 10 it takes 160 nanoseconds to assemble each word that is stored in memory 16. If this clock period is shortened, or if the number of binary bits in the words is shortened the increments by which our variable delay circuit may be changed may be made less than 160 nanoseconds. For example, if a 100 megahertz clock is used to drive serial to parallel converter 10 and only four bit words are assembled therein, the basic increment by which our variable time delay circuit may be changed is 40 nanoseconds. This is derived by multiplying the period of the 100 megahertz master clock signal, which is 10 nanoseconds, by fou bits which make up the binary words assembled in converter 10. Returning to the embodiment of the invention described herein, every 160 nanoseconds a binary word is assembled and stored in memory 16. For the shortest possible time that can be achieved with this embodiment the first bit of an eight bit word stored in converter 10 is held therein for 160 nanoseconds before being transferred to buffer storage circuit 15. Within the subsequent time between 160 nanoseconds and 240 nanoseconds this particular binary word is stored in memory and then the same binary word is read out of memory between 240 nanoseconds and 320 nanoseconds to buffer 21 from which the first bit is read out between 320 nanoseconds and 340 nanoseconds. Thus, the minimum time delay through our circuit is 340 nanoseconds. If, for example, the circuit is presently writing a binary word in memory location 160 and is reading binary words out of memory location 155 immediately thereafter, memory 16 is introducing a delay of five increments each equal to 160 nanoseconds. Thus, memory 16 introduces a total of 800 nanoseconds delay which when added to the 160 nanosecond delay introduced by serial to parallel converter 10, to the 160 nanosecond delay required to write into and read out of memory 16, and to the 20 nanosecond delay introduced by multiplexer 23 results in a total delay of 1,140 nanoseconds of our novel circuit. Thus, for a difference between the write address and the read address equal to zero our circuit introduces a time delay of 340 nanoseconds, for a difference of one the delay is 500 nanoseconds, for a difference of two the delay is 660 nanoseconds, for a difference of three the delay is 820 nanoseconds, for a difference of four the delay is 980 nanoseconds, for a difference of five the delay is 1,140 nanoseconds, for a difference of six the delay is 1,300 nanoseconds, for a difference of seven the delay is 1,460 nanoseconds, for a difference of eight the delay is 1,620 nanoseconds, for a difference of nine the delay is 1,780 nanoseconds, for a difference of ten the delay is 1,940 nanoseconds and so on. With memory 16 being able to store a total of 256 eight bit binary words in this example the maximum delay that may be introduced utilizing our circuit is 41,140 nanoseconds. It can be appreciated, however, that this is a relatively small memory. Using eight conventional 16K memories in which can be stored 16,384 eight bit words our novel delay circuit can provide 2.6216 milliseconds of time delay. Such time delays are unheard of in the art and may be implemented utilizing our invention by changing the memory chip used in our circuit to have a larger capacity.

Using the two's complement examples hereinabove described and the above listed time delays achieved using specified differences between write and read addresses, a specific time delay is picked along with its corresponding difference between write address and read addresses. Using the example above, assuming that it is desired to have a time delay of 1,140 nanoseconds, which corresponds to an address difference of 5, the decimal value of 5 is first computed as 00000101 and then the two's complement is taken of this binary number which is 11111011. The two's complement number is the number that is stored in latch 19 and thereby enables our novel time delay circuit to provide 1,140 nanoseconds of delay.

Many changes may be made in the circuit of the preferred embodiment of the invention described herein without departing from the spirit and scope of the invention. For example, adder circuit 18 need not be utilized but a difference circuit may replace it and then the binary number stored in latch 19 would not be a two's complemented number. Another change that may be made would be to utilize a memory 16 which does not have separate input and outputs. In this case another multiplexer circuit would have to be added to switch the memory circuit between the input circuitry consisting of converter 10 and buffer 15, and the output circuitry consisting of multiplexer 23 and buffer 21. These are all changes that may be made by those skilled in the art. In addition, it would be recognized that our novel time delay circuit may be utilized with an infinitely variable time delay circuit of conventional form that provides a small amount of time delay. In this manner the combination of our novel time delay and such a conventional infinitely variable time delay circuit may be combined to provide long time delays but which may provide any desired time delay, not just the discrete steps provided by our novel circuit alone. As previously described, the frequency of clock 11, the number of bits stored in serial to parallel converter 10, and other changes may be made to vary the discrete steps of time delay provided by our novel circuit.

What we claim is:

1. A variable digital delay circuit comprising:
   timing means including timing signal generation means;
   means for periodically sampling a signal to be delayed by a predetermined period of time;
   memory means for storing each signal sample taken by said sampling means following taking the sample; and
   means for reading a previously stored signal sample out of said memory means immediately following storing a signal sample therein, each signal sample being read out of said memory means having been stored therein a selected period of time determined by the timing signal generation means before being read out, the selected period of time corresponding to said predetermined period of time;
   the timing means controlling said sampling means, said memory means and said reading means.

2. The invention in accordance with claim 1 wherein said timing means comprises first memory addressing means generating write addresses that are used to address and memory means to store said signal samples therein.

3. The invention in accordance with claim 2 wherein said reading means comprises second memory addressing means generating read addresses that are used to address said memory means to read said signal samples therefrom.

4. The invention in accordance with claim 3 wherein said timing means further comprises first logic means for alternately applying the addresses generated by said first and said second memory addressing means to said memory means.

5. The invention in accordance with claim 4 wherein said reading means further comprises:
   first means for storing each signal sample read out of said memory means responsive to said addresses from said second memory addressing means, and
   second logic means for reading said signal sample stored in said first storing means to produce said delayed signal sample.

6. The invention in accordance with claim 5 wherein each signal sample is made up of a predetermined number of individual signal samples periodically made of said signal being sampled and wherein said sampling means comprises:
   second memory means controlled by said timing means to store each said individual signal sample until said predetermined number of samples making up a group of samples is taken, and
   third memory means controlled by said timing means, to which each said group of signal samples is transferred from said second memory means and thereby allowing another group of signal samples to be stored in said second memory means, the contents of said third memory means being read from the second memory means from an address generated by said first memory addressing means.

7. The invention in accordance with claim 6 wherein said timing means comprises:
   oscillator means, and
   timing logic means responsive to said oscillator means to generate timing signals for controlling said sampling means and each of said memory means and said reading means.

8. The invention in accordance with claim 7 wherein said second memory means comprises a shift register responsive to said timing signals from said timing logic means.

9. The invention in accordance with claim 8 wherein said first logic means and said second logic means both comprise multiplexers responsive to said timing signals from said timing logic means.

10. The invention in accordance with claim 8 wherein said second memory addressing means comprises:
    fourth memory means in which is stored a binary number indicating said predetermined period of time for said time delay, and
    means for algebraically adding said binary number with said write address currently being generated by said first memory addressing means to thereby generate said read address.

* * * * *